United States Patent
Keh et al.

(10) Patent No.: US 7,951,863 B2
(45) Date of Patent: May 31, 2011

(54) COATED PACKAGE WITH FILTER PROFILE

(75) Inventors: Kean Loo Keh, Penang (MY); Chin Hin Oon, Penang (MY); Boon Keat Tan, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 1024 days.

(21) Appl. No.: 11/744,955

(22) Filed: May 7, 2007

(65) Prior Publication Data

US 2008/0105939 A1 May 8, 2008

Related U.S. Application Data

(63) Continuation of application No. 10/902,200, filed on Jul. 28, 2004, now Pat. No. 7,229,671.

(51) Int. Cl.
*B32B 27/38* (2006.01)
*B05D 3/10* (2006.01)
*H01L 25/00* (2006.01)

(52) U.S. Cl. ......... 524/394; 427/386; 428/413; 428/414
(58) Field of Classification Search .................. None
See application file for complete search history.

(56) References Cited

U.S. PATENT DOCUMENTS

| | | | | |
|---|---|---|---|---|
| 3,512,027 A | * | 5/1970 | Kupsky | 313/499 |
| 4,865,038 A | * | 9/1989 | Rich et al. | 600/344 |
| 5,390,271 A | * | 2/1995 | Priest | 385/92 |
| 5,398,041 A | * | 3/1995 | Hyatt | 345/88 |
| 5,432,526 A | * | 7/1995 | Hyatt | 345/87 |
| 5,517,313 A | * | 5/1996 | Colvin, Jr. | 356/417 |
| 5,638,818 A | * | 6/1997 | Diab et al. | 600/476 |
| 6,800,870 B2 | * | 10/2004 | Sayag | 250/584 |
| 2002/0127144 A1 | * | 9/2002 | Mehta | 422/81 |

* cited by examiner

*Primary Examiner* — John J Figueroa

(57) ABSTRACT

Method for packaging a photo detector integrated circuit (IC) and a pigment filter and resulting package are described. An encapsulated package (e.g., an epoxy-encapsulated package) that includes a first surface is provided. A filter layer is then coated directly onto the first surface. The filter layer provides optical filtering properties (e.g., a predetermined filtering profile) in addition to the filtering provided by the pigment filter.

4 Claims, 5 Drawing Sheets

US 7,951,863 B2

COATED PACKAGE WITH FILTER PROFILE

This patent application is a continuation of parent U.S. patent application Ser. No. 10/902,200 filed Jul. 28, 2004 now U.S. Pat. No. 7,229,671 entitled "Method for Coating Package with a Filter Profile" to Kean Loo Keah, and claims priority and other benefits therefrom. The foregoing '200 patent application is hereby incorporated by reference herein, in its entirety.

BACKGROUND OF THE INVENTION

The packaging and assembly of die ("chips") is an important in the manufacture of integrated circuits. This packaging process is further complicated when the circuit includes a color sensor since the packaging involves integrating optical components with electronic circuits.

For example, a color sensor needs to be integrated wilt a color filter (e.g., a pigment filter). Currently, the types of material utilized for the color filter limit the types of filter profiles that can be generated. To address this shortcoming, the integration process typically includes a separate step of attaching glass that is coated with an optical profile that supplements the filtering properties of the color filter.

In one prior an approach illustrated in FIG. 4, glass with a desired filter profile is attached to an encapsulated package. This approach has the following advantages: 1) Filter profile coat on glass are readily available (e.g., standard parts), 2) proven and often used in industry. However, this approach suffers from the following disadvantages: 1) increased packaging costs; 2) tighter process controls for filter attachment process; 3) filter attachment process has a relatively low efficiency, such as a low unit per hour (UPH); and 4) increased total package height since there is an additional thick layer of Glass substrate.

In another prior an approach illustrated in FIG. 5, glass with a desired filter profile is attached in an air gap package. 1) Filter profile coat on glass are readily available (e.g., standard parts), 2) proven and often used in industry, 3) air gap packages are in general robust and have good reliability result. However, this approach suffers from the following disadvantages: 1) increased packaging costs since more piece parts arm require; 2) tighter process controls for filter attachment process; 3) filter attachment process has a relatively low efficiency (e.g., a low unit per hour (UPH); 4) increased total package height since there is an additional thick layer of Glass substrate); and 5) air gap package size is limited in terms of miniaturization.

Both of these approaches significantly increase the total package size and also the total cost of the product. Furthermore the attachment of the glass filter requires tight process control to ensure that the filter is attached in a robust manner and that the filter will not become un-attached in the field.

Based on the foregoing, there remains a need for a method for packaging a photo detector that overcomes the disadvantages set forth previously.

SUMMARY OF THE INVENTION

According to one embodiment of the present invention, a method for packaging an integrated circuit (e.g., a photo detector IC) and a pigment filter and resulting package are described. An encapsulated package (e.g., an epoxy-encapsulated package) that includes a first surface is provided. A filter layer is then coated directly onto the first surface. The filter layer provides optical filtering properties (e.g., a predetermined filtering profile) in addition to the filtering provided by the pigment filter.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

A method for packaging a photo detector integrated circuit (IC) and resulting package are described. In the following description, for the purposes of explanation, numerous specific details are set forth in order to provide a thorough understanding of the present invention. It will be apparent, however, to one skilled in the an that the present invention may be practiced without these specific details. In other instances, well-known structures and devices are shown in block diagram four in order to avoid unnecessarily obscuring the present invention.

Figure 1:
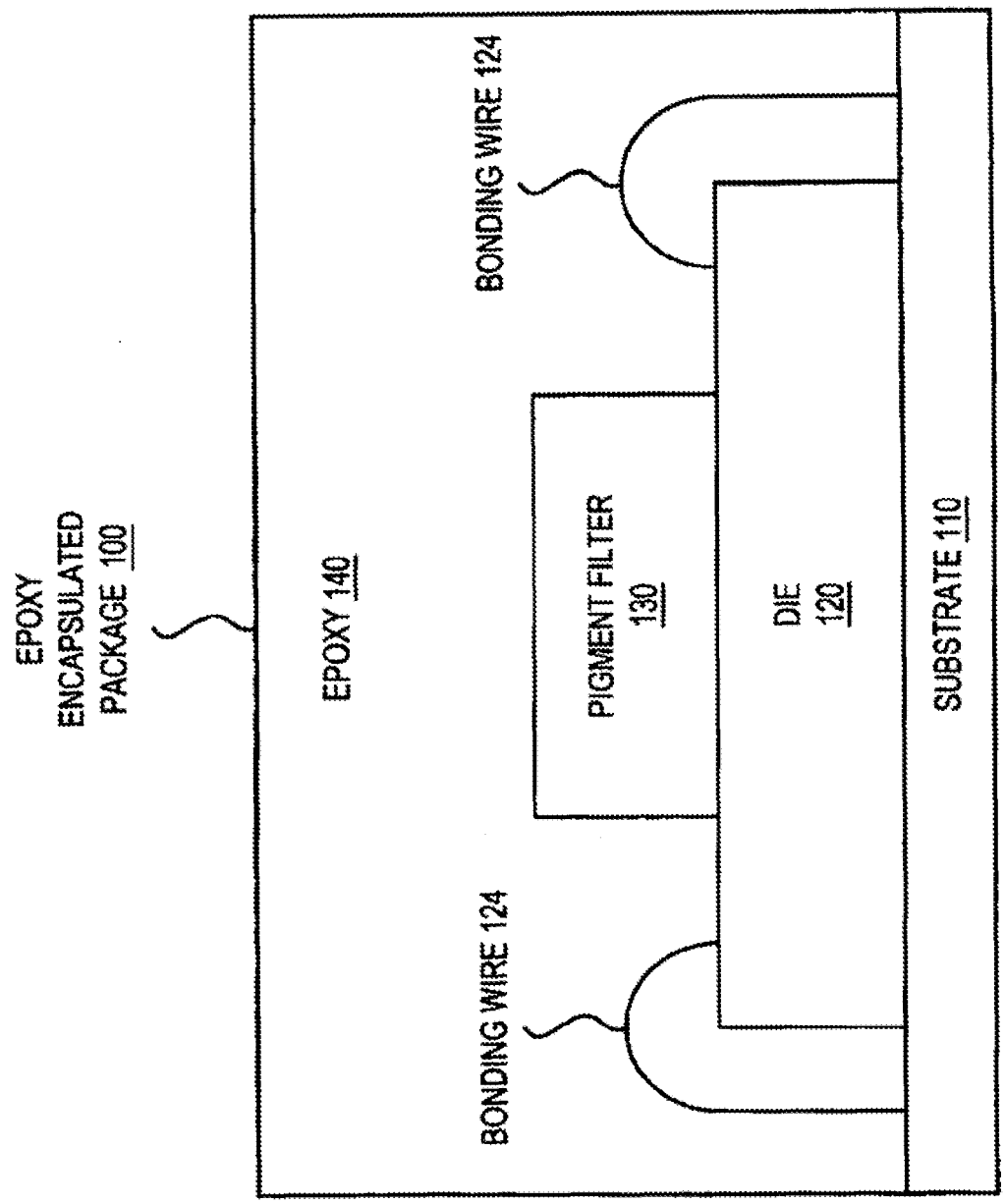
FIG. 1 illustrates an encapsulated package that includes a pigment filter and a microchip.

FIG. 1 illustrates an epoxy encapsulated package 100 that includes a pigment filter and a microchip. Prior to encapsulation, a substrate 110 is provided. A die 120 (hereinafter referred to as "microchip") is then attached to the substrate 110. The die 120 is then wire bonded to substrate 110 through wires (e.g., bonding wires 124). A pigment filter 130 is also integrated with a microchip 120 prior to encapsulation. In this embodiment, the microchip 120 includes a photo detector integrated circuit which is also referred to herein as an "image sensor" or "color sensor." The microchip 120 is referred to herein as "integrated circuit," "integrated circuit die" or simply "die."

The pigment filter 130 can be, for example, a photosensitive organic color Filter layer. The pigment filter 130 is processed by lithographic methods to form a desired pattern on the microchip 120. The pigment filter 130 is integrated with the microchip 120 by utilizing processing techniques known to those of ordinary skill in the art It is noted that this process of integrating the microchip 120 with the pigment filter 130 is limited by the materials that can be used for the pigment filter 130. Consequently, only limited filter profiles can be created. One example of the limitations of these filter profiles is that the pigment filter 130 is unable to block infrared light. These limited filter profiles and limitations or deficiencies related thereto, necessitate further processing steps (e.g., incorporating an additional infrared blocking filter) to address these limitations as described in greater detail hereinafter.

An epoxy 140 (e.g., a clear epoxy) is then utilized to encapsulate the components (e.g., substrate 110, die 120, pigment filter 130, and wires 124) to arrive at an epoxy encapsulated package 100 (also referred to simply as "encapsulated package").

Encapsulated Package with Filter Profile

Figure 2:
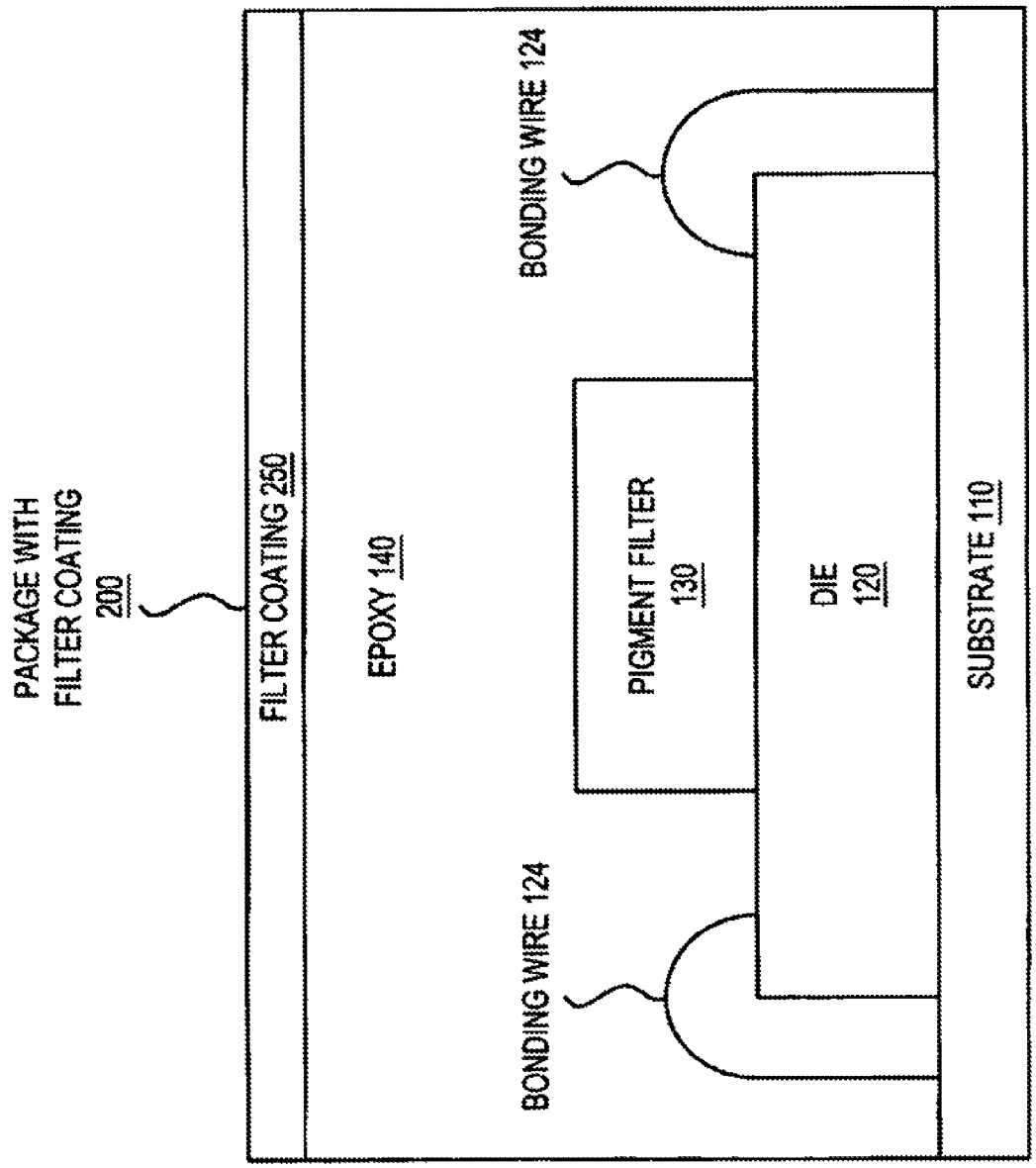
FIG. 2 illustrates an encapsulated package with a filter coated thereon according to one embodiment of the invention.

FIG. 2 illustrates an encapsulated package 200 with a filter coated thereon according to one embodiment of the invention.

After encapsulation, an interference filter profile layer 250 is applied to the encapsulated package 100 according to one embodiment of the invention. According to the invention, an interference filter layer 250 is applied to the encapsulated package illustrated in FIG. 1. For example, interference filter layer 250 can be blanket coated directly onto the epoxy-encapsulated package of FIG. 1.

The interference filter 250 can be tailored to complement the deficiencies of the pigment filter 130. In one embodiment, the interference filter 250 includes an infrared (IR) blocking filter to remove infrared light. The processing of the interference filter layer 250 is described in greater detail hereinafter with reference to FIG. 3.

Processing

Figure 3:
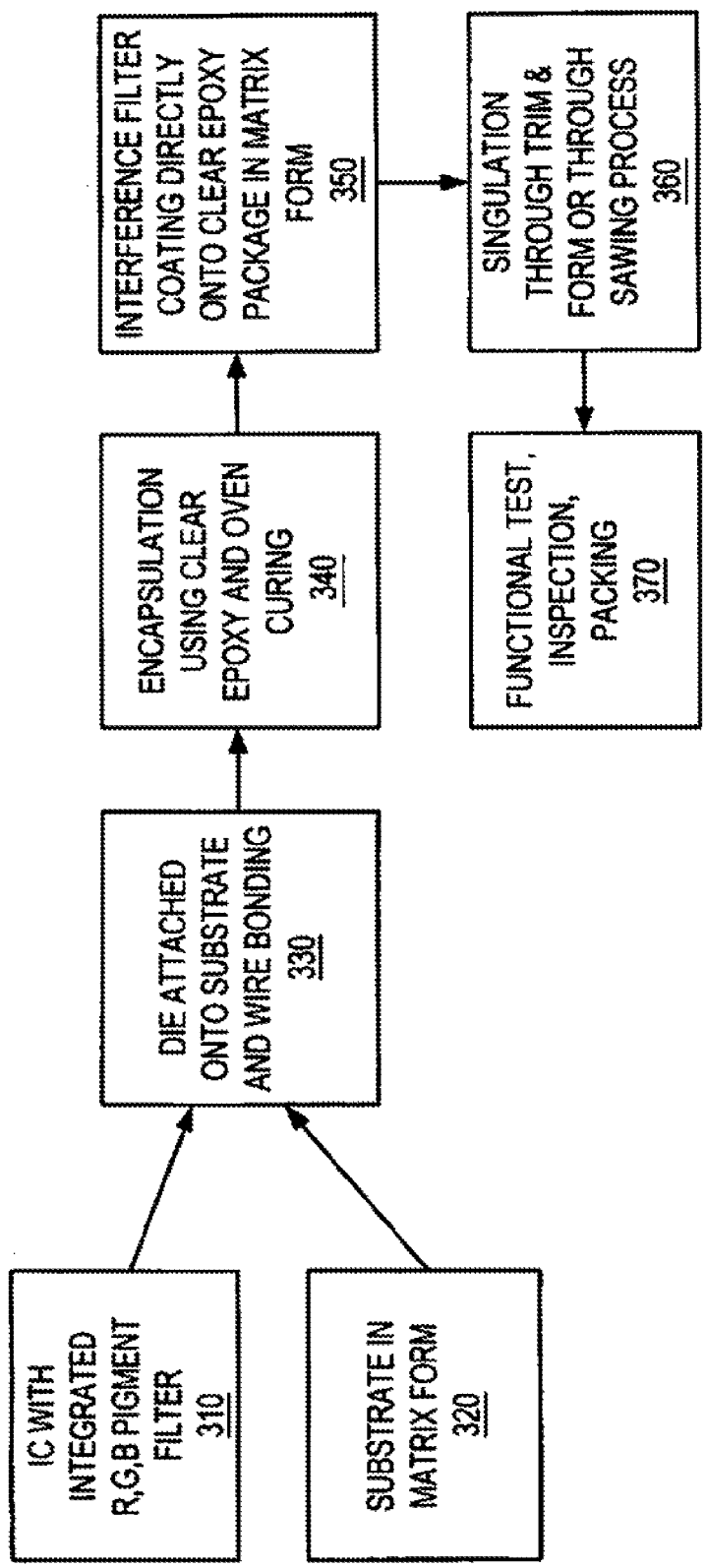
FIG. 3 is a flow chart illustrating the processing steps to manufacture the encapsulated package according to one embodiment of the invention.
Figure 4:
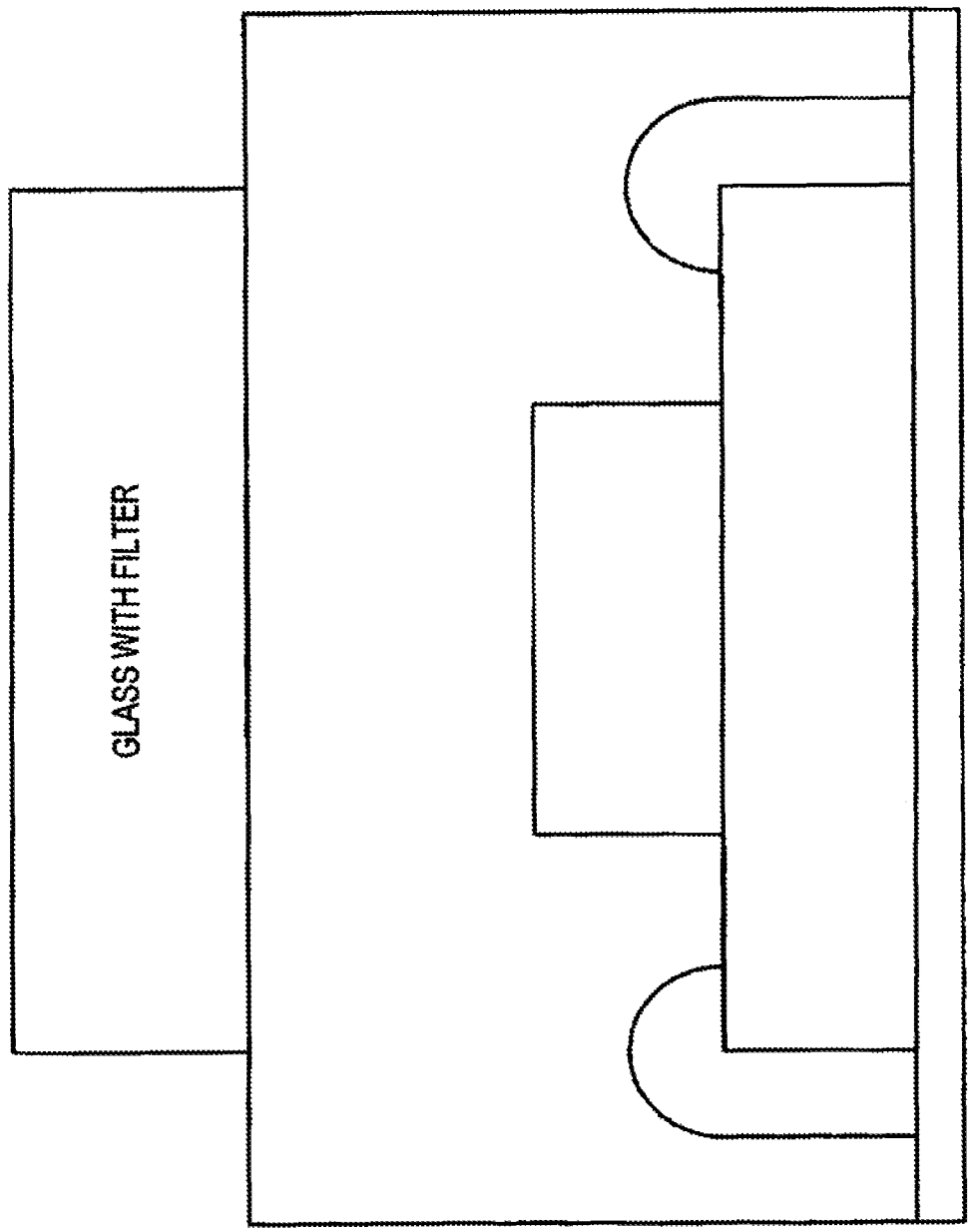
FIG. 4 illustrates a prior art package that uses a glass filter.
Figure 5:
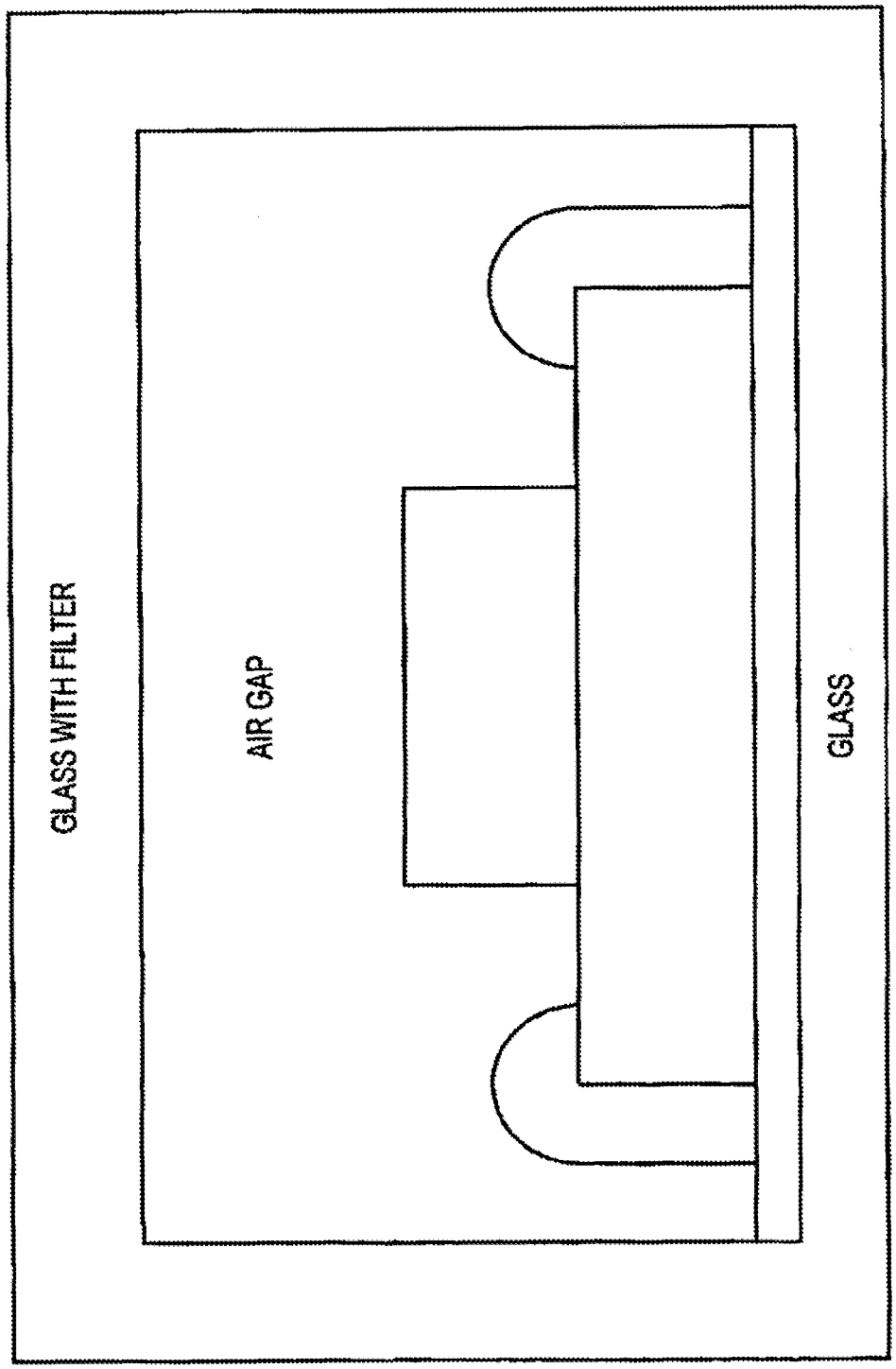
FIG. 5 illustrates a prior art package that employs an air gap and glass filter.

FIG. 3 is a flow chart illustrating the processing steps to manufacture the encapsulated package according to one embodiment of the invention. In step 310, an integrated circuit that is integrated with a pigment filter (e g., a RGB pigment filter) is provided. In step 320, a substrate 110 in matrix form is provided. Matrix form means that the substrate is designed in such a manner so that the substrate can accommodate a high number of units (e.g., a high density in terms of numbers of units). The processing according to the invention provides bulk manufacturing, high efficiency, and a reduction in manufacturing cost.

In step 330, the die is attached onto the substrate, and wire bonding is performed. In step 340, encapsulation is performed by utilizing a clear epoxy and oven curing.

In step 350, a filter profile (e.g., an interference filter) is coated directly onto the epoxy encapsulated package in matrix form. Matrix form can be, for example, a high-density substrate, where there are many units in one substrate. The filter profile is directly coated onto the encapsulated package by depositing dielectric and metallic materials such as SiO2, TiO2, or Al, in thin layers that are typically equal in thickness to one-quarter the wavelength of the light used in the application. These thin films alternate between layers of high index of refraction, and low index of refraction, thereby inducing the interference effects needed. In one embodiment, the filter profile is directly coated onto the encapsulated package by using a sputtering process that involves Ion Beam Sputter (IBS), a sputter process in which energetic ions are produced by an ion gun.

In another embodiment, the filter profile is directly coated onto the encapsulated package by using Physical Vapor Deposition (PVD). A coating material is heated causing evaporation such that evaporate condenses on the optic, leaving a film. The coating material can be heated by a focus beam of electrons or by heat derived through electrical resistance.

In another embodiment, the filter profile is directly coated onto the encapsulated package by sputter, where energetic molecules of coating material are created by smashing accelerated ions into a target of coating material. The sputtered material then forms a durable, stable deposit on the optic. The accelerated ions are normally produced from a plasma of inert Argon.

In one embodiment, following processing steps are performed for directly producing a thin film on the encapsulated package (e.g., an IR filter coating process according to the invention).

1) Prepare tooling to mount the encapsulated package in process chamber.
2) Clean encapsulated package and load them into tooling.
3) Clean chamber and refill with source material needed to produce coating evaporates. Prepare monitoring system.
4) Load tooling containing encapsulated package components into chamber.
5) Reduce chamber pressure to predetermined pressure (e.g., $<2\times10^{-5}$ Torr) and heat chamber to predetermined temperature (e.g., 200-300° C.).
6) Deposit coating layers as per coating design.
7) Cool and vent coating chamber.
8) Remove encapsulated packages from chamber and test optics for coating performance.
9) Inspect and wrap encapsulated packages.

The coating material can be heated by a focus beam of electrons or by heat derived through electrical resistance. The coating can be made of materials that include, but are not limited to, $MgF_2$, $Ta_2O_5$, $Al_2O_3$, $SiO_2$, $TiO_2$, an Al.

It is noted that the materials selected for the filter coating 250 are not limited as would be the case if the filter profile were implemented in the pigment filter 130.

In step 360, singulation through trim and form or through a sawing process is performed. In step 370, a functional test inspection, and packing are performed.

It is noted that the processing of the filter profile according to the invention is especially suitable for high volume manufacturing, where cost advantages and size advantages can be realized by customizing the filter coating process to perform the coating directly onto the encapsulated packages in high density form. One aspect of the filter profile processing according to the invention is process optimization and process customization techniques to enable directly coating onto the encapsulated package. For example, the filter profile pressing according to the invention can be applied to manufacture high volume, small size products.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. An integrated circuit color sensor package, comprising:
   an integrated circuit die comprising a color sensor photodetector and a first light filter disposed over the photodetector, the color sensor photodetector being incorporated into and forming a portion of the integrated circuit die, the first light filter being a photosensitive organic color filter;
   a substrate upon which the integrated circuit is mounted;
   wherein at least portions of the first light filter, the integrated circuit die and the substrate are encapsulated by a light transmissive epoxy encapsulant comprising an upper surface; and
   a coating disposed over at least portions of the upper surface and above the first light filter, the coating being configured to form a second light filter.

2. The package of claim 1, wherein the second light filter is an interference filter.

3. The package of claim 2, wherein the interference filter includes an infrared (IR) block filter.

4. The package of claim 2, wherein the package is configured for high volume manufacturing; and wherein the second light filter is formed directly on a plurality of encapsulated packages in high density form.

* * * * *